United States Patent
Son et al.

(10) Patent No.: US 7,483,463 B2
(45) Date of Patent: Jan. 27, 2009

(54) RIDGE-WAVEGUIDE SEMICONDUCTOR LASER DIODE

(75) Inventors: Joong-kon Son, Seoul (KR); Tae-hoon Jang, Seoul (KR); Youn-joon Sung, Yongin-si (KR); Tan Sakong, Suwon-si (KR); Ho-sun Paek, Suwon-si (KR); Sung-nam Lee, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 11/505,871

(22) Filed: Aug. 18, 2006

(65) Prior Publication Data

US 2006/0280215 A1    Dec. 14, 2006

(30) Foreign Application Priority Data

Feb. 9, 2006    (KR) .............. 10-2006-0012602

(51) Int. Cl.
*H01S 5/00* (2006.01)

(52) U.S. Cl. ................. 372/45.01; 372/46.01

(58) Field of Classification Search ............ 372/45.012, 372/46.01, 75, 45.011, 46.011, 50.1, 43.01
See application file for complete search history.

(56) References Cited

U.S. PATENT DOCUMENTS

| 4,622,673 | A * | 11/1986 | Tsang ............... 372/45.01 |
| 6,356,571 | B1 * | 3/2002 | Kiely et al. ............ 372/43.01 |
| 6,479,836 | B1 * | 11/2002 | Suzuki et al. ............ 257/15 |
| 6,614,824 | B2 * | 9/2003 | Tsuda et al. ............ 372/46.01 |
| 6,983,003 | B2 * | 1/2006 | Sonobe et al. ........... 372/45.01 |
| 2004/0051107 | A1 * | 3/2004 | Nagahama et al. ........ 257/79 |

* cited by examiner

*Primary Examiner*—Minsun Harvey
*Assistant Examiner*—Tuan N. Nguyen
(74) *Attorney, Agent, or Firm*—Buchanan Ingersoll & Rooney PC

(57) ABSTRACT

A ridge-waveguide semiconductor laser diode with an improved current injection structure is provided. The ridge-waveguide semiconductor laser diode includes: a substrate; a lower multi-semiconductor layer formed on the substrate; an active layer formed on the lower multi-semiconductor layer; an upper multi-semiconductor layer having a ridge portion and formed on the active layer; and an upper electrode formed on the upper multi-semiconductor layer, wherein the upper electrode covers at least one side surface of the ridge portion.

21 Claims, 4 Drawing Sheets

RIDGE-WAVEGUIDE SEMICONDUCTOR LASER DIODE

CROSS-REFERENCE TO RELATED PATENT APPLICATION

This application claims the benefit of Korean Patent Application No. 10-2006-0012602, filed on Feb. 9, 2006, in the Korean Intellectual Property Office, the disclosure of which is incorporated herein in its entirety by reference.

BACKGROUND OF THE DISCLOSURE

1. Field of the Disclosure

The present disclosure relates to a ridge-waveguide semiconductor laser diode (LD), and more particularly, to a ridge-waveguide semiconductor LD configured such that a current is laterally injected through side surfaces of a ridge portion.

2. Description of the Related Art

Semiconductor laser diodes (LDs) are widely used for transmitting, recording, and reading data in communication devices, such as optical communication devices, or in electronic devices, such as compact disk players (CDPs) or digital video disk players (DVDPs).

As the use of the semiconductor LDs has increased, semiconductor LDs having a low critical current value and a ridge portion that suppresses multiple transverse mode oscillation have been developed. The ridge portion is formed by upwardly protruding a p-type cladding layer and a p-type contact layer, and a current (holes) is vertically injected down into the ridge portion. However, the vertical current injection has a drawback in that high power is consumed and heat is generated due to the high resistance of a region doped with an impurity, such as magnesium (Mg), when the current (holes) passes through p-type semiconductor layers including the p type cladding layer and a p-type waveguide layer.

SUMMARY OF THE DISCLOSURE

The present invention may provide a ridge-waveguide semiconductor laser diode with an improved current injection structure.

According to an aspect of the present invention, there may be provided a ridge-waveguide semiconductor laser diode comprising: a substrate; a lower multi-semiconductor layer formed on the substrate; an active layer formed on the lower multi-semiconductor layer; an upper multi-semiconductor layer having a ridge portion and formed on the active layer; and an upper electrode formed on the upper multi-semiconductor layer, wherein the upper electrode covers at least one side surface of the ridge portion.

BRIEF DESCRIPTION OF THE DRAWINGS

The above and other features and advantages of the present invention are illustrated in detailed exemplary embodiments thereof with reference to the attached drawings in which.

DETAILED DESCRIPTION OF EXEMPLARY EMBODIMENTS

The present invention will now be described more fully with reference to the accompanying drawings, in which exemplary embodiments of the invention are shown.

Figure 1:
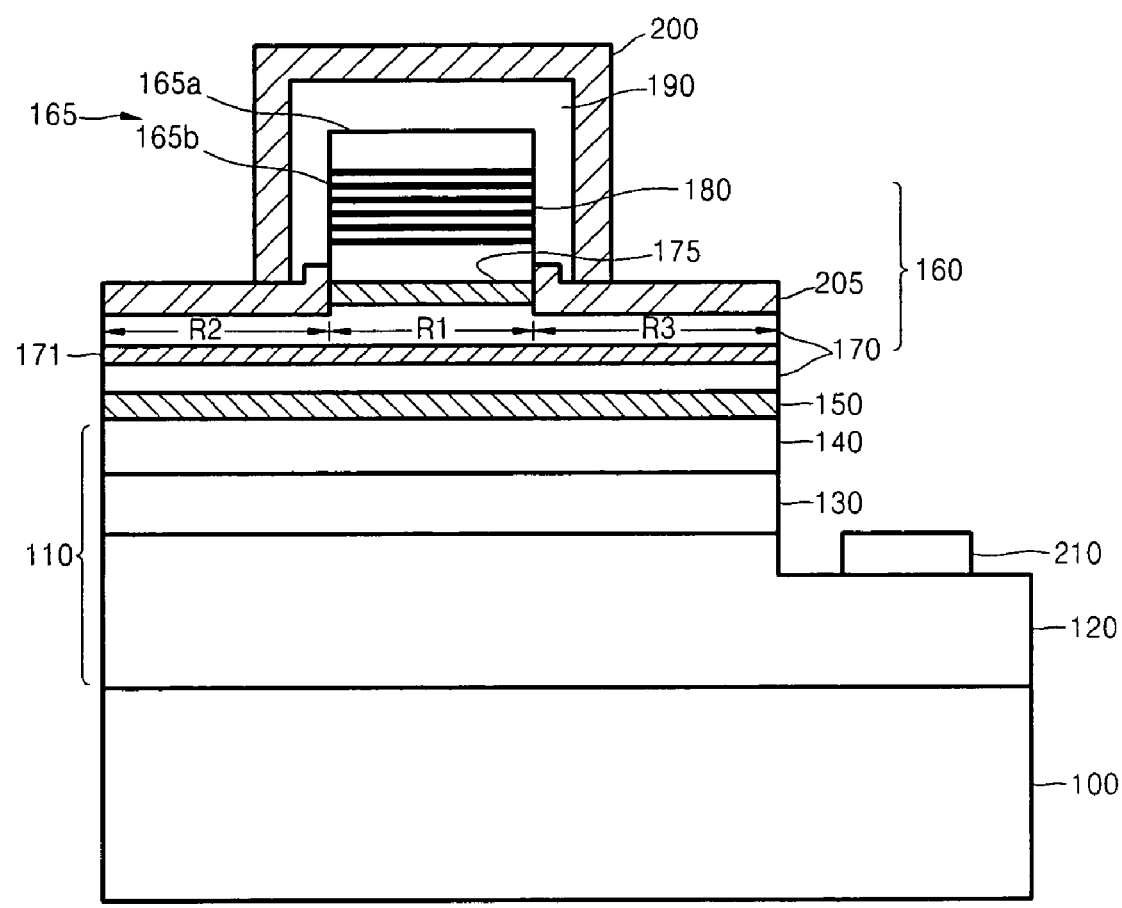
FIG. 1 is a cross-sectional view of a ridge-waveguide semiconductor laser diode (LD) according to an embodiment of the present invention.

FIG. 1 is a cross-sectional view of a ridge-waveguide semiconductor laser diode (LD) according to an embodiment of the present invention.

Referring to FIG. 1, a lower multi-semiconductor layer 110 is formed on a substrate 100. The lower multi-semiconductor layer 110 includes a lower contact layer 120, a lower cladding layer 130, and a lower waveguide layer 140. An active layer 150, an upper multi-semiconductor layer 160, an upper contact layer 190, and an upper electrode 200 are sequentially formed on one side of the lower contact layer 120, and a lower electrode 210 is formed on the other side of the lower contact layer 120.

The upper multi-semiconductor layer 160 may be divided into first through third regions R1, R2, and R3.

The first region R1 has a ridge portion 165 protruding in a stripe shape from a central part of the upper multi-semiconductor layer 160. The ridge portion 165 may protrude vertically or may be inclined to have a trapezoidal cross-section.

The upper multi-semiconductor layer 160 includes an upper waveguide layer 170 and an upper cladding layer 180. A part of the upper waveguide layer 170 and the upper cladding layer 180 are formed on the ridge portion 165.

An electron blocking layer 171 may be formed in the upper waveguide layer 170. The energy level of the electron blocking layer 171 is much higher than that of the upper waveguide layer 170 such that the electron blocking layer 171 can prevent electron overflow.

A current spreading layer 175 may be embedded in the upper waveguide layer 170. The current spreading layer 175 is disposed on the ridge portion 165 on the upper waveguide layer 170. The current spreading layer 175 allows an injected current to spread over the entire surface thereof, such that the current can be uniformly injected into the active layer 150.

The upper contact layer 190 and the upper electrode 200 cover at least one side surface 165b of the ridge portion 165, such that the current can be injected through the side surface 165b. In order to inject the current through an upper surface 165a of the ridge portion 165, the upper contact layer 190 and the upper electrode 200 may also be formed to cover the upper surface 165a of the ridge portion 165.

The second and third regions R2 and R3 are formed on parts of the upper waveguide layer 170 outside the ridge portion 165, and insulating layers 205 are formed on the second and third regions R2 and R3. The insulating layers 205 cover both lateral edges of the current spreading layer 175. The insulating layers 205 insulate the upper contact layer 190 from the upper waveguide layer 170 and the current spreading layer 175.

The ridge-waveguide semiconductor LD of the present embodiment may be a GaN-based semiconductor LD. In detail, the ridge-waveguide semiconductor LD may be formed as described hereafter.

The substrate 100 may be formed of sapphire ($Al_2O_3$), gallium nitride (GaN), silicon (Si), aluminium nitride (AlN), or silicon carbide (SiC).

The lower contact layer 120 may be formed of n-GaN. The lower cladding layer 130 may be formed of n-$Al_xGa_{1-x}N$ ($0 \leq x < 1$). The lower waveguide layer 140 may be formed of n-$In_xGa_{1-x}N$ ($0 \leq x < 1$). The active layer 150 may be formed of $In_xGa_{1-x}N$ ($0 < x < 1$) and have a single-quantum well or multi-quantum well structure. The upper waveguide layer 170 may be formed of p-$In_xGa_{1-x}N$ ($0 \leq x < 1$). The electron blocking layer 171 may be formed of a p-$Al_xGa_{1-x}N$ ($0 < x < 1$) compound semiconductor.

The current spreading layer 175 may have a hetero-junction structure of a p-GaN layer and a p-InGaN layer so that the energy level of the current spreading layer 175 can be much lower than the energy level of the upper waveguide layer 170.

The upper cladding layer 180 may be a single layer formed of p-$Al_xGa_{1-x}N$ ($0 \leq x < 1$) or may have a superlattice structure formed by alternately and repeatedly stacking p-$Al_xGa_{1-x}N$ ($0 \leq x < 1$) layers having different aluminum (Al) composition ratios. For example, the upper cladding layer 180 may have a superlattice structure where a p-$Al_{0.08}Ga_{0.92}N$ layer and a p-GaN layer are repeatedly stacked. The superlattice structure leads to a reduction in both carrier injection resistance and the risk of cracks, and thus the upper cladding layer 180 can be stably crystal-grown and a high optical confinement effect can be maintained.

The upper contact layer 190 improves ohmic contact properties between the upper cladding layer 180 and the upper electrode 200, and may be formed by sequentially stacking $p^+$-GaN/Pd layers on an upper surface 180a and side surfaces 180b of the upper cladding layer 180.

The upper electrode 200 may be made of a highly conductive metallic material, for example, a commonly used electrode material. In detail, the upper electrode 200 may be a single layer formed of Au, Ni, Ti, or Al, or may be a double layer of these materials.

The insulating layers 205 may be formed of an insulting material such as $SiO_2$.

Figure 2:
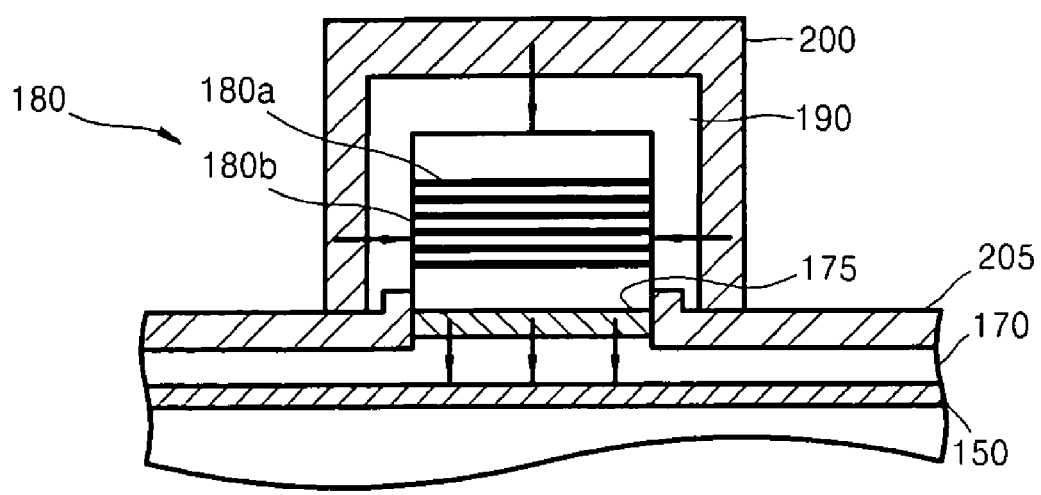
FIG. 2 is a cross-sectional view illustrating a current injection structure of the ridge-waveguide semiconductor LD of FIG. 1.

The operation of the ridge-waveguide semiconductor LD according to the present embodiment will now be explained with reference to FIG. 2. FIG. 2 is a cross-sectional view illustrating a current injection structure of the ridge-waveguide semiconductor LD of FIG. 1.

Referring to FIG. 2, when a voltage is applied to the upper electrode 200, a current, that is, carriers are injected into the upper contact layer 190. When the layers formed on the active layer 150 are p-type layers as described above, the carriers injected into the upper contact layer 190 are holes. Since the upper electrode 200 and the upper contact layer 190 cover the upper cladding layer 180, the carriers are injected through the side surfaces 180b as well as through the upper surface 180a of the upper cladding layer 180. When the current is injected through the side surfaces 165b of the ridge portion 165 as shown in FIG. 2, a path through which the carriers pass in the p-type upper cladding layer 180 with high resistance is shortened, thereby reducing the carrier injection resistance. Also, the current path when the current is injected through the upper surface 180a and the side surfaces 180b has a larger area than the current path when the current is injected through only the upper surface 180a, thereby reducing resistance. As a result, since the same power can be provided at a lower operating voltage than that when a conventional ridge-waveguide semiconductor LD is used, the ridge-waveguide semiconductor LD of the present embodiment is superior to the conventional ridge-waveguide semiconductor LD in terms of the operating voltage and power. In addition, since the current injected through the side surfaces 180b spreads while passing through the current spreading layer 175, the current is prevented from flowing to a side.

Also, when the upper cladding layer 180 has a superlattice structure formed by alternately stacking p-$Al_xGa_{1-x}N$ ($0 \leq x1$) layers having different Al composition ratios, the carriers pass through the upper cladding layer 180 by tunneling or carrier overflow, thereby further reducing the injection resistance.

Moreover, since the upper electrode 200 made of a metallic material with high thermal conductivity covers both the side surfaces 180b as well as the upper surface 180a of the upper cladding layer 180, the ridge-waveguide semiconductor LD of the present embodiment has high heat dissipation capability.

Furthermore, the ridge-waveguide semiconductor LD of the present embodiment can improve the electrical characteristics of a long wavelength semiconductor LD. In general, semiconductor LDs emitting a blue or green laser beam with a long wavelength use a low temperature p-type semiconductor layer. The low temperature p-type semiconductor layer is inferior in terms of electrical characteristics to a high temperature p-type semiconductor layer in that the hole concentration is low and resistance is high in the low temperature p-type semiconductor. The ridge-waveguide semiconductor LD of the present embodiment can improve the electrical characteristics of the long-wavelength semiconductor LD that uses the low temperature semiconductor layer, by improving a current injection mechanism.

The effect of a ridge-waveguide semiconductor LD according to an embodiment of the present invention compared to a conventional ridge-waveguide semiconductor LD will be explained hereafter.

Conventional Ridge-waveguide Semiconductor LD

Figure 3:
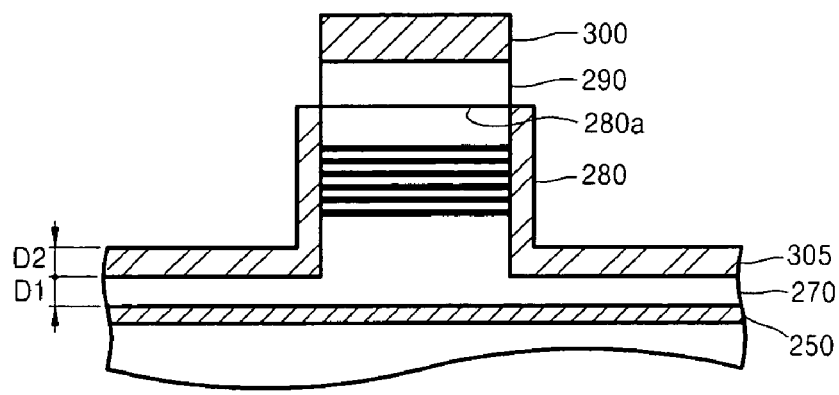
FIG. 3 is a cross-sectional view of a conventional ridge-waveguide semiconductor LD.

A conventional ridge-waveguide semiconductor LD having a vertical current injection structure as shown in FIG. 3 was manufactured. The conventional ridge-waveguide semiconductor LD was a III group nitride-based semiconductor LD. An upper waveguide layer 270 was formed on an active layer 250. An upper cladding layer 280 upwardly protruded from a central part of the upper waveguide layer 270. The upper cladding layer 280 constitutes a ridge portion. An upper contact layer 290 and an upper electrode 300 were sequentially stacked on an upper surface 280a of the upper cladding layer 280. Insulating layers 305 were formed on side surfaces of the upper cladding layer 280 and upper surfaces of the upper waveguide layer 270 outside the ridge portion. The thickness D1 of the upper waveguide layer 270 outside the ridge portion was approximately 500 Å, and the thickness D2 of the insulating layers 305 was approximately 1500 Å or less.

Ridge-Waveguide Semiconductor LD of the Present Embodiment

A ridge-waveguide semiconductor LD allowing both vertical and lateral injection according to an embodiment of the present invention as shown in FIG. 2 was manufactured. The ridge-wavelength semiconductor LD of the present embodiment was similar to the conventional ridge-waveguide semiconductor LD except that an upper contact layer 190 and an upper electrode 200 were formed to cover side surfaces 165b as well as an upper surface 165a of an upper cladding layer 180, as shown in FIGS. 1 and 2.

The characteristics of the manufactured two LDs will now be explained with reference to FIG. 4 and FIGS. 5A and 5B.

Figure 4:
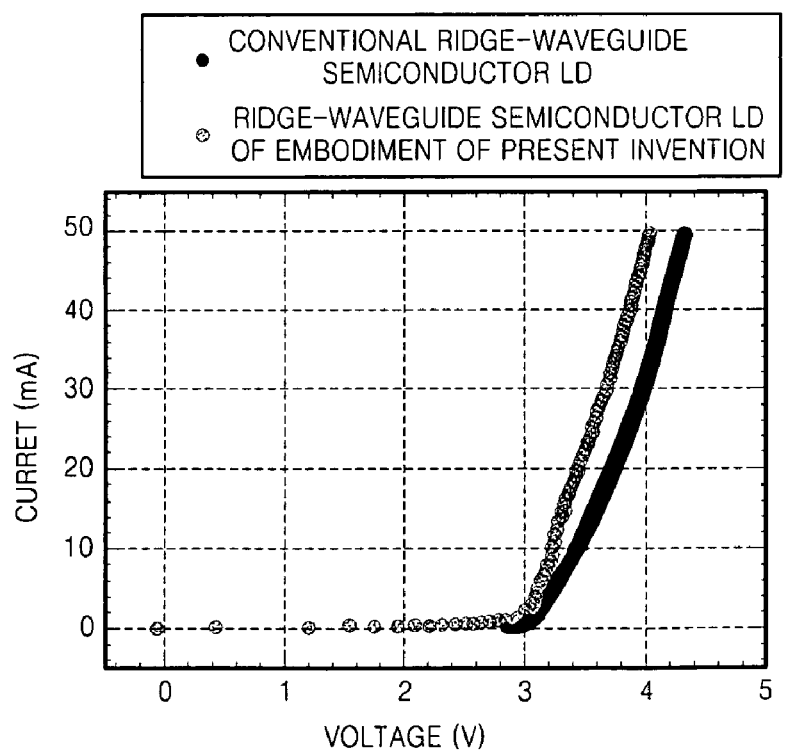
FIG. 4 is a graph illustrating a relationship between an operating voltage and an operating current for the conventional ridge-waveguide semiconductor LD of FIG. 3 and a ridge-waveguide semiconductor LD according to an embodiment of the present invention.

FIG. 4 is a graph illustrating a relationship between an operating voltage and an operating current for the conventional ridge-waveguide semiconductor LD of FIG. 3 and a ridge-waveguide semiconductor LD according to an embodiment of the present invention. Referring to FIG. 4, in the conventional ridge-waveguide semiconductor LD, the operating voltage required to produce a current of 50 mA was 4.36 V, whereas in the ridge-waveguide semiconductor LD of the present embodiment, the operating voltage required to produce a current of 50 mA was 4.03V, about 0.3 V lower than 4.36 V. That is, while the injection resistance of the conventional ridge-waveguide semiconductor LD was 17.0 Ω, the injection resistance of the ridge-waveguide semiconductor LD of the present embodiment was 15.5 Ω.

Figure 5A:
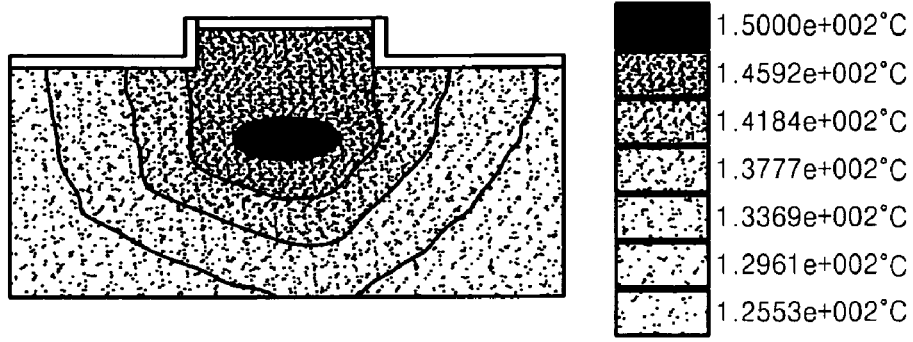
FIGS. 5A and 5B are diagrams illustrating temperature distributions of the two LDs whose operating currents and voltages are illustrated in FIG. 4.
Figure 5B:
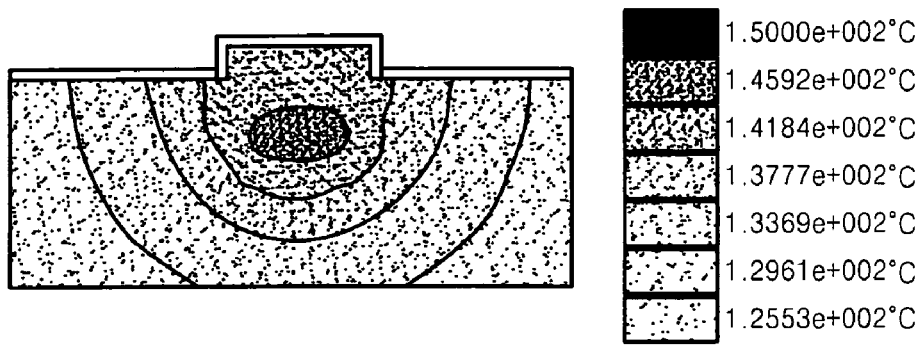

FIGS. 5A and 5B are diagrams illustrating temperature distributions of the conventional ridge-waveguide semiconductor LD and the ridge-waveguide semiconductor LD of the present embodiment, respectively. Referring to FIGS. 5A and 5B, the temperature of the ridge-waveguide semiconductor LD of the present embodiment was generally lower than the temperature of the conventional ridge-waveguide semiconductor LD. While the conventional ridge-waveguide semiconductor LD had a surface temperature of 130.47° C., the ridge-waveguide semiconductor LD of the present embodiment had a surface temperature of 117.93° C., about 10% lower than 130.47° C. This is because the ridge-waveguide semiconductor of the present embodiment reduces heat generation in the upper cladding layer due to the low injection resistance of the upper cladding layer and can discharge heat through the upper electrode made of metal formed on the side surfaces of the upper cladding layer.

As described above, the ridge-waveguide semiconductor LD according to the present invention has the following advantages.

First, since a current is injected through both the side surfaces of the ridge portion, injection resistance can be reduced and high operating voltage and power can be achieved.

Second, since the upper electrode made of a metallic material covers both the side surfaces of the ridge portion, efficient heat dissipation can be ensured.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A ridge-waveguide semiconductor laser diode comprising:
   a substrate;
   a lower multi-layered semiconductor formed on the substrate;
   an active layer formed on the lower multi-layered semiconductor;
   an upper multi-layered semiconductor having a multi-layered semiconductor ridge portion and formed on the active layer, the ridge portion having an upper surface substantially parallel to layers of the upper multi-layered semiconductor and side surfaces transverse to the upper surface of the ridge portion and the layers of the upper multi-layered semiconductor, and the ridge portion including an upper cladding layer;
   an upper electrode formed on the upper multi-layered semiconductor; and
   an upper contact layer formed between the upper electrode and the upper cladding layer, the upper cladding layer including side surfaces respectively corresponding to the side surfaces of the ridge portion, and an upper surface within the ridge portion,
   wherein the upper electrode covers at least one of the side surfaces of the ridge portion transverse to the upper surface of the ridge portion and the layers of the upper multi-layered semiconductor, and is configured to inject current through the at least one side surface of the ridge portion, and
   wherein the upper contact layer is formed between the upper electrode and the side surfaces and the upper surface of the upper cladding layer.

2. The ridge-waveguide semiconductor laser diode of claim 1, wherein the upper electrode covers the at least one side surface and the upper surface of the ridge portion.

3. The ridge-waveguide semiconductor laser diode of claim 1, wherein the upper multi-layered semiconductor includes an upper waveguide layer, and the ridge portion includes a part of the upper waveguide layer.

4. The ridge-waveguide semiconductor laser diode of claim 3, wherein the upper cladding layer has a superlattice structure formed by alternately and repeatedly stacking $Al_xGa_{1-x}N$ ($0 \leq x < 1$) layers having different aluminum (Al) composition ratios.

5. The ridge-waveguide semiconductor laser diode of claim 3, wherein current applied to the upper electrode is injected through a plurality of side surfaces of the upper cladding layer.

6. The ridge-waveguide semiconductor laser diode of claim 1, further comprising a current spreading layer embedded in the upper waveguide layer and formed in the ridge portion.

7. The ridge-waveguide semiconductor laser diode of claim 6, wherein the current spreading layer has a heterojunction structure of a p-GaN layer and a p-InGaN layer.

8. The ridge-waveguide semiconductor laser diode of claim 6, further comprising insulating layers for insulating the upper contact layer from the upper waveguide layer and the current spreading layer.

9. The ridge-waveguide semiconductor laser diode of claim 6, wherein current applied the upper electrode is injected through a plurality of side surfaces of the upper cladding layer, and the current spreading layer embedded in the upper waveguide layer is configured to spread the injected current across the sides of the upper cladding layer.

10. The ridge-waveguide semiconductor laser diode of claim 1, wherein the lower multi-layered semiconductor is formed of an n-type semiconductor, and the upper multi-layered semiconductor is formed of a p-type semiconductor.

11. The ridge-waveguide semiconductor laser diode of claim 1, wherein the lower multi-layered semiconductor, the active layer, and the upper multi-layered semiconductor are formed of GaN-based materials.

12. The ridge-waveguide semiconductor laser diode of claim 1, wherein:
   the upper multi-layered semiconductor includes an upper cladding layer within the ridge portion;
   the upper cladding layer includes side surfaces respectively corresponding to the side surfaces of the ridge portion, and an upper surface within the ridge portion; and
   the upper electrode covers the side surfaces of the upper cladding layer.

13. The ridge-waveguide semiconductor laser diode of claim 12, wherein current applied to the upper electrode is injected through the side surfaces of the upper cladding layer.

14. The ridge-waveguide semiconductor laser diode of claim 12, wherein the upper electrode further covers the upper surface of the upper cladding layer.

15. The ridge-waveguide semiconductor laser diode of claim 14, wherein current applied to the upper electrode is injected through the side surfaces and the upper surface of the upper cladding layer.

16. The ridge-waveguide semiconductor laser diode of claim 14, further comprising an upper contact layer formed between the upper electrode and the upper cladding layer.

17. The ridge-waveguide semiconductor laser diode of claim 16, wherein the upper electrode covers side surfaces and an upper surface of the upper contact layer respectively covering the side surfaces and the upper surface of the upper cladding layer.

18. The ridge-waveguide semiconductor laser diode of claim 14, wherein the upper electrode covering the side surfaces and the upper surface of the upper cladding layer is configured to dissipate heat from the side surfaces and the upper surface of the upper cladding layer.

19. The ridge-waveguide semiconductor laser diode of claim 1, wherein the ridge portion of the upper multi-layered semiconductor protrudes from a central region of the upper multi-layered semiconductor.

20. The ridge-waveguide semiconductor laser diode of claim 1, wherein the ridge portion of the upper multi-layered semiconductor is substantially rectangular.

21. The ridge-waveguide semiconductor laser diode of claim 1, wherein the ridge portion has a trapezoidal cross-section.

* * * * *